United States Patent [19]

Maxner

[11] 4,292,727

[45] Oct. 6, 1981

[54] AUTOMATIC INSERTION EQUIPMENT

[75] Inventor: Richard B. Maxner, Danvers, Mass.

[73] Assignee: USM Corporation, Farmington, Conn.

[21] Appl. No.: 124,084

[22] Filed: Feb. 25, 1980

[51] Int. Cl.³ .................. H05K 3/30; B21F 11/00
[52] U.S. Cl. ........................ 29/566.3; 29/564.8; 29/715; 140/105; 227/79
[58] Field of Search .......... 29/566.3, 564.8, 566.1, 29/715, 741; 140/105; 227/79

[56] References Cited

U.S. PATENT DOCUMENTS

| | | | |
|---|---|---|---|
| 3,034,382 | 5/1962 | Hazel | 29/564.8 |
| 3,429,170 | 2/1969 | Romeo | 29/566.3 X |
| 3,646,659 | 3/1972 | Ragard | 29/715 X |
| 3,859,707 | 1/1975 | Ragard et al. | 29/566.3 |
| 3,986,533 | 10/1976 | Woodman | 140/105 |
| 4,087,034 | 5/1978 | Kikkawa | 29/566.1 X |
| 4,151,637 | 5/1979 | Zemek et al. | 29/566.1 |
| 4,153,082 | 5/1979 | Foley | 140/105 |
| 4,165,557 | 8/1979 | Taguchi | 29/566.3 |
| 4,218,817 | 8/1980 | Takano | 29/715 X |

*Primary Examiner*—William R. Briggs
*Attorney, Agent, or Firm*—Owen J. Meegan

[57] ABSTRACT

A cut-clinch mechanism with a movable knife that is arranged to be slidably attached to a piston rod so that when the cutting edge of the knife engages a lead-in wire, a sensor will be contacted to indicate the lead-in wire is in a proper position for cutting and clinching.

8 Claims, 6 Drawing Figures

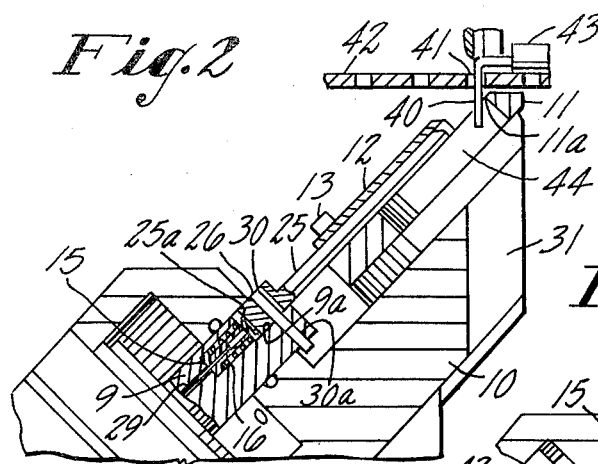
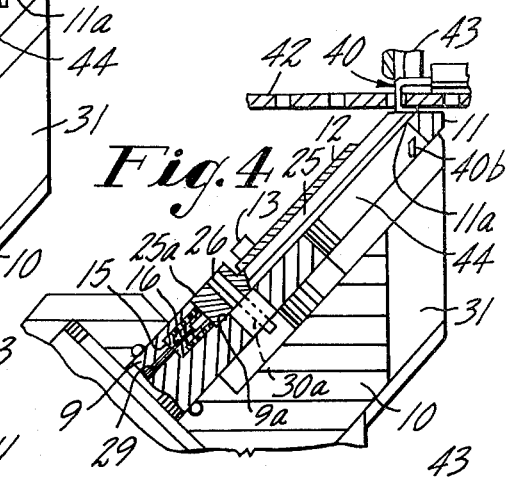
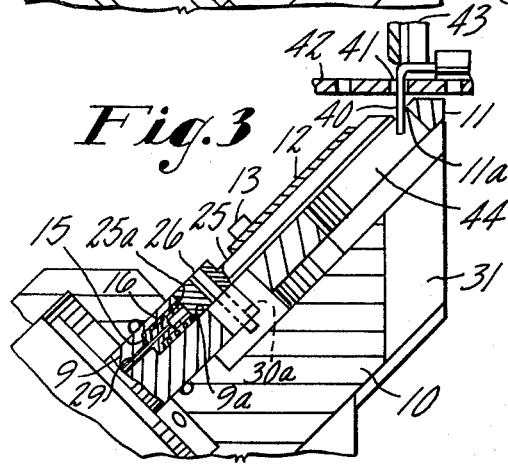
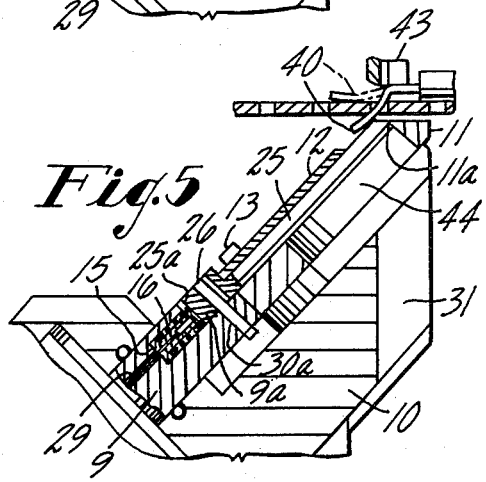
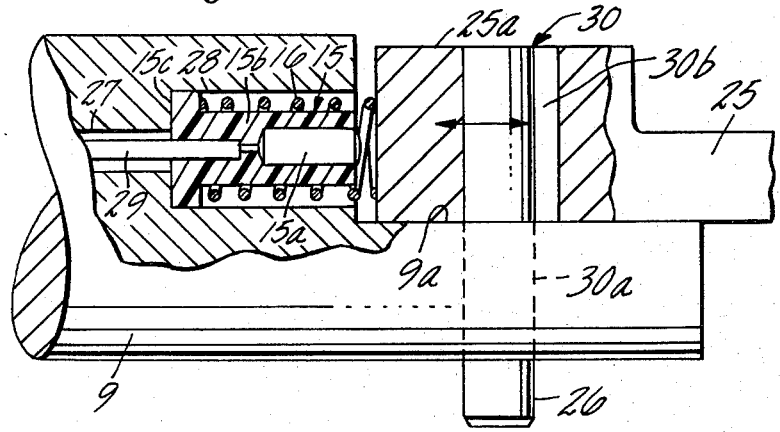

AUTOMATIC INSERTION EQUIPMENT

BACKGROUND OF THE INVENTION

Printed circuit boards are extensively used in the electronics industry and they are usually provided with preformed holes to receive the leads of various components to be electrically interconnected by the printed circuitry. It has been found that such electronic components can be quickly and economically inserted into printed circuit boards through the use of automatic equipment which has been programmed to rapidly place the leads of the components into the proper holes. The leads that are provided on the components are of a generally standard length and are usually much longer than needed after the component has been placed into the board. With the automatic equipment, these excessive length leads are located in a position relative to the board and are then inserted through the holes. The equipment will then automatically trim and clinch the leads and careful trimming and clinching assures proper contact between the lead and the printed circuit board and also removal of excess wire thereby providing accurate, reliable and neat connections.

Although the cut and clinch mechanisms presently used effectively clinch the electronic component against the printed circuit board and also effectively trim the excess leads, I have found that the operation sometimes fails because of a mis-alignment between the lead-in wire and the cut-clinch mechanism. Good cutting and clinching requires that the lead-in wires be inserted normal to the circuit board and from time to time, a wire becomes bent from that position prior to working upon it. Thus, the cut-clinch mechanism will not engage the wire and perform its function.

(1) Field of the Invention

The present invention relates to equipment for securing wire terminals to workpieces and particularly to equipment for inserting and securing electronic components to printed circuit boards by cutting and clinching the lead wires of such electronic components.

(2) Prior Art

Component inserters of the type generally under consideration in the present invention are described, for example, in the U.S. Pat. Nos. to Romeo, 3,429,170 and Woodman, 3,986,533. These patents disclose inserters that are rotatable and reciprocable upon an axis and they include a pair of reciprocal cutting and clinching elements that are mounted for angular rotation to orient the elements in accordance with the orientation of the leads passing through the board. When the inserter is reciprocated on its axis, the cutting elements move to shear unnecessary lengths of wire that extend through the circuit board and also crimp a small portion of the wire against the circuit board for securing the component and for the establishment of an electrical connection. Neither of these patents disclose a mechanism for detecting whether or not the lead-in wires which are inserted through the printed circuit board are actually in place to be shorn and clinched. In the U.S. Pat. to Taguchi, No. 4,165,557, a mechanism is disclosed for trimming and securing parallel lead-in wires of electronic components and sensing whether each lead-in wire is disposed within the mechanism. In that patent, sensing is accomplished prior to the cutting and clinching by contact of the lead-in wires with electrical sensors that are disposed within the cut-clinch unit.

SUMMARY OF THE INVENTION

According to the present invention I have developed a cut-clinch mechanism that includes a fixed knife and a movable knife and a means to drive the movable knife into a cutting relationship with the fixed knife. The movable knife is attached to a drive, such as a piston rod, by means of a link which allows limited movement of the movable knife relative to the drive. A sensing mechanism is utilized to determine if the movable knife has achieved the limited movement, if such limited movement has been achieved, and if the lead-in wire has been properly disposed between the fixed knife and the movable knife when the movable knife engages the lead-in wire. The movable knife is normally biased away from the drive by a spring that urges the movable knife toward the link and in a direction parallel to the movement of the drive. If a lead-in wire is not disposed between the fixed knife and the movable knife, contact will not be made with the sensor and the failure to make contact can be recorded. Thus, the signal is produced as a result of cutting and unless cutting occurs the signal will not be generated.

BRIEF DESCRIPTION OF THE DRAWINGS

FIGS. 2, 3 and 4 are sequential elevational views, partially in cross-section, showing stages of motion of the movable knife relative to the fixed knife together with the sensing mechanism that is disposed in operative relationship with the movable knife to establish whether a lead-in wire is properly disposed within the cut-clinch mechanism.

FIG. 5 shows a lead-in wire that is mis-aligned relative to the cut-clinch mechanism and the disposition of the movable knife relative to the sensor.

FIG. 6 is an enlarged view of the movable knife and sensor showing in detail the engagement of the movable knife by the spring and the positioning of the link between the drive and the movable knife.

DESCRIPTION OF THE PREFERRED EMBODIMENTS

Figure 1:
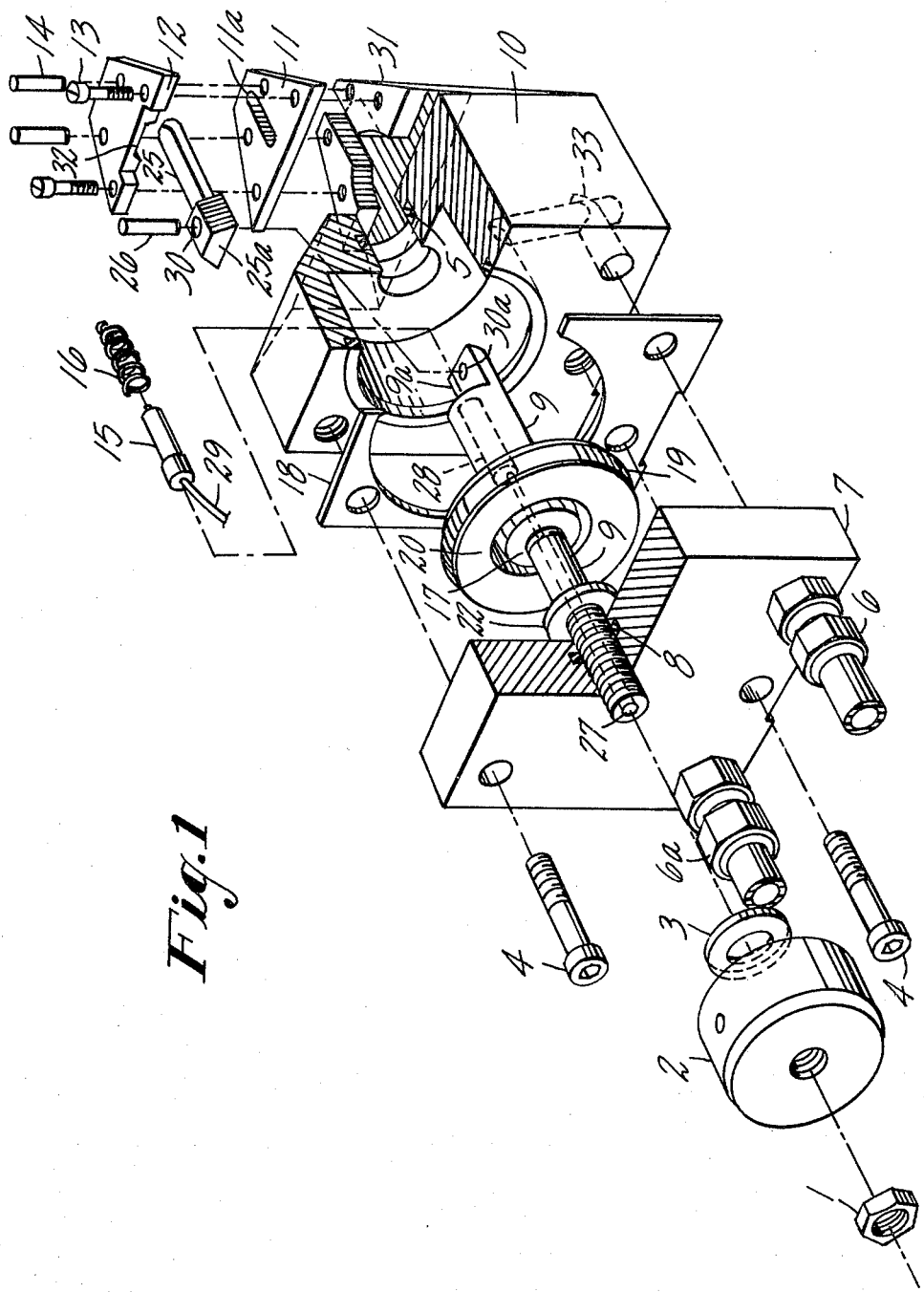
FIG. 1 is an exploded view, partially in cross-section, showing a preferred embodiment of the cut-clinch unit according to the present invention.

As shown in FIG. 1, the cut-clinch mechanism of the present invention includes a cylinder block 10 that has a cylinder cap 7 mounted thereon and secured by cylinder cap screws 4. A gasket 18 is disposed between the cylinder cap 7 and the cylinder block 10, as is conventional in the piston art. A piston 20 is slidably disposed within the cylinder block 10 and is surrounded by an 'O' ring 19 that engages the inner walls of the cylinder block 10. A piston rod 9 extends from each side of the piston 20 and is carried thereby in response to air pressure received and withdrawn through fittings 6 and 6a. One end of the piston rod 9 extends outwardly of the cylinder cap 7 and is seated therein. A bumper 3 is disposed immediately adjacent the exterior cylinder cap 7 and is fitted about the piston rod 9. A stop nut 2 is threaded upon the piston rod 9 and secured in place by a piston lock nut 1. The piston rod 9 has an axial bore 27 formed therein which is in communication with an enlargement 28. A sensor 15 is disposed in the enlargement and a wire 29 extends through the bore 27 to an indicator mechanism (not shown). When nested in the enlargement 28, the sensor 15 is surrounded by a spring 16 that urges against the trailing end 25a of the movable knife 25.

A roll pin or link 26 is disposed within a hole 30 that is formed in the trailing end 25a of the movable knife 25. The hole 30 has an inner diameter which is slightly greater than the outer diameter of the link 26, generally in the order of about 1/16 of an inch. The bottom of the trailing end 25a rests upon a flat surface 9a formed in the piston rod 9 and is free to move by the amount of free play between the link 26 and the walls of the hole 30. When assembled, the link 26 is slipped through the hole 30 and then into a hole 30a formed on the flat surface 9a. The internal diameter of the hole 30a is substantially the same as the outside diameter of the link 26 so that a snug fitting is provided.

A fixed knife 11 having a slot forming a cutting edge 11a is supported upon an extension 31 of the cylinder block 10 and is retained in place by a knife retainer 12 that is fitted thereover. The knife retainer 12 is secured to the fixed knife 11 by means of retainter screws 13 and fixed knife pins 14 that fit through holes formed in the respective parts and which are threaded into the extension 31 of the cylinder block 10. The movable knife 25 is free to slide in the direction of movement of rod 9 within the track 32 formed in the knife retainer 12.

In operation, the piston 20 travels within the cylinder block 10 and 'O' ring seals 5 and 8 are provided in the cylinder block 10 and the cylinder cap 7 to prevent leakage of the presurizing gasses introduced through fittings 6 and 6a. The piston 20 is secured upon the piston rod 9 by means of a piston retaining nut 17 the piston retaining nut 17 being arranged to abut against the bumper 22 as the piston retracts from an extended position. As the piston 20 moves forward within the cylinder block 10, rod 9 is moved forward carrying with it movable knife 25 that is attached to rod 9 by means of link 26. As has been stated, spring 16 continually urges movable knife 25 away from sensor 15 and if no obstruction is imposed in its path, a signal will not be transmitted through the wire 29 which will indicate an improper insertion. If a lead-in wire is disposed between cutting edge 11a of fixed knife 11 and movable knife 25, trailing end 25a will overcome the resistance of spring 16 and engage sensor 15 and transmit a signal.

Referring now to FIGS. 2, 3 and 4 the cut-clinch mechanism of the present invention is shown disposed beneath a circuit board 42 with a lead-in wire of an electronic component disposed through one of the holes. The lead-in wire is placed in registry with the cut-clinch mechanism. It is to be appreciated that the cut-clinch mechanism of the present invention generally comes in pairs so that each member will simultaneously cut and clinch the two lead-in wires as are normally associated with electronic components. The board is held in a conventional retaining mechanism and the inserter which holds the component can also be of conventional design.

In FIG. 2 the movable knife 25 is disposed in the retracted position and the lead-in wire 40 has been inserted within a hole 41 of the circuit board 42 by an inserter 43. The lead-in wire 40 is closely adjacent the cutting edge 11a of the fixed knife 11 and depends in an aperture 44. The spring 16 urges the rear end of the hole 30 in the trailing end 25a of the movable knife 25 against the rear of the link 26 thereby leaving a small space between the front of the hole 30 and the link 26. The space is greater than the space between the trailing end 25a of the movable knife and the sensor 15.

After the lead-in wire 40 has been disposed in a cutting relationship against the cutting edge 11a of the fixed knife 11, piston rod 9 is actuated by air pressure against the piston 20 and travels forward carrying with it movable knife 25. As the cutting edge of movable knife 25 engages lead-in wire 40 the strength of spring 16 is overcome thereby forcing the movement of trailing end 25a relative to sensor 15 and providing a signal to indicate that lead-in wire 40 is properly disposed for cutting and clinching.

As shown in FIG. 4 the movable knife 25 has been extended to a position where lead-in wire 40 has been bent beneath circuit board 42 to attach it thereto by crimp 40a. At the same time, the excess lead-in wire 40b has been shorn and is shown dropping through extension 31 of cylinder block 10. As can be seen, link 26 still engages the front of hole 30 during the cut and clinch operation. Following the cutting and clinching, the rod 9 is retracted carrying with it movable knife 25 which will resume the position shown in FIG. 2 wherein the spring forces movable knife 25 forward so that the link 26 engages the rear of hole 30 and the equipment is ready for another insertion operation.

In FIG. 5 the movable knife 25 is shown in an extended position immediately adjacent the cutting edge 11a of fixed knife 11. In this figure however, the lead-in wire was not correctly disposed immediately adjacent the cutting edge 11a. Instead, the lead-in wire 40 was inappropriately positioned more adjacent the circuit board (or as shown in dotted lines, above the circuit board) thereby not providing an obstacle to engage the cutting edge of movable knife 25. Since no obstacle was placed in the path of the movable knife, spring 16 was not overcome and trailing end 25a did not engage sensor 15 and also, trailing end 25a did not slide over flat surface 9a. No signal was provided from contact between sensor 15 and trailing end 25a thereby enabling the operator of the equipment to know that the wire had been improperly inserted and was not cut and clinched.

FIG. 6 shows an enlargement of the cut and clinch mechanism shown in FIGS. 1 through 5. As can be seen rod 9 has an axial bore 27 through which an insulated wire 29 extends to sensor 15. Sensor 15 is formed of a probe 15a surrounded by a resinous material 15b which is sufficiently strong to withstand the shock of engagement with trailing end 25a of movable knife 25 and to provide electric insulation of probe 15a from rod 9. Trailing end 25a is free to move on flat portion 9a of rod 9 as the cutting edge of movable knife 25 engages a lead-in wire from an electronic component (not shown). Such movement is limited by the free space 30b within hole 30 which allows a limited amount of travel because the diameter of link 26 is smaller than the inner diameter of hole 30.

I prefer to make sensor 15 by placing a wire within a cup-like mold with one end of the wire extending through the bottom thereof. A soldered lead contact is crimped around the wire and will extend a short distance above the top of a mold. I prefer to imbed the wire and contact in a urethane plastic which is poured into the mold. Air bubbles are broken up to insure that the mold is completely filled around the contact and wire. Following the pouring of urethane, the material is cured and the sensor is demolded and inspected for complete insulation of the wire and contact and any voids in the molded product. As shown in FIG. 6 a small flange 15c can be formed in the molded plastic and this flange can be made of a diameter substantially equal to the enlargement 28 so as to firmly seat the sensor therein. The flange 15c is also of sufficient size to enable one to place the spring 16 therearound so as to provide a recessable nesting for the parts.

It is apparent that modifications and changes can be made within the spirit and scope of the present invention but it is my intention only to be limited by the appended claims.

Having thus described my invention, what I claim as new and desire to secure by Letters Patent of the United States is:

1. A cut-clinch mechanism including a fixed knife and a movable knife and means to drive said movable knife into cutting relationship with said fixed knife, the improvement which comprises:

means linking said movable knife to said drive means, said linking means allowing a limited movement of said movable knife relative to said drive means and sensing means to determine if said movable knife has achieved said limited movement.

2. A cut-clinch mechanism including a fixed knife and a movable knife and means to drive said movable knife into cutting relationship with said fixed knife, the improvement which comprises:

said drive means including a piston rod and means linking said movable knife to said piston rod, said linking means allowing limited movement of said movable knife relative to said piston rod in directions toward and away from the movement of said piston rod and sensing means to detect if said movable knife has achieved movement toward said piston rod.

3. The cut-clinch mechanism according to claims 1 or 2 wherein said drive means has a holding means disposed at one end thereof and said sensing means is disposed in said holding means.

4. The cut-clinch mechanism according to claim 3 wherein said sensing means is an electrical contact disposed so as to touch said movable knife if said movable knife has achieved said limited movement.

5. The cut-clinch mechanism according to claim 4 wherein a spring urges said movable knife away from said sensor, said spring being tensioned so as to be overcome when said movable knife contacts a lead-in wire disposed adjacent said fixed knife.

6. The cut-clinch mechanism according to claim 4 wherein said sensor includes an electrical contact imbedded within a plastic material so as to insulate said electrical contact from said drive means.

7. A cut-clinch mechanism including a fixed knife and a movable knife said movable knife being arranged to be driven into a cutting relationship with said fixed knife, the improvement which comprises:

a piston rod and a link rigidly affixed to said piston rod;

said movable knife having a hole formed therein so as to receive said link, said hole being wider than said link thereby allowing limited movement of said movable knife relative to said link;

spring means engaging said movable knife and urging said movable knife away from said piston rod;

sensing means disposed within said piston rod and arranged to provide a signal by contact with said movable knife if said limited movement has been achieved.

8. The cut-clinch mechanism according to claim 7 wherein said sensing means is an electrical contact imbedded within plastic material so as to insulate said electrical contact from said piston rod.

* * * * *